United States Patent [19]

Hirasawa et al.

[11] Patent Number: 5,340,702
[45] Date of Patent: Aug. 23, 1994

[54] METHOD OF FORMING FINE RESIST PATTERN

[75] Inventors: Hiroyuki Hirasawa, Yokohama; Minako Kobayashi, Kawasaki; Yasuo Matsuki, Yokohama, all of Japan

[73] Assignee: Japan Synthetic Rubber Co., Ltd., Tokyo, Japan

[21] Appl. No.: 923,894

[22] PCT Filed: Dec. 26, 1991

[86] PCT No.: PCT/JP91/01766
§ 371 Date: Aug. 27, 1992
§ 102(e) Date: Aug. 27, 1992

[87] PCT Pub. No.: WO92/12466
PCT Pub. Date: Jul. 23, 1992

[30] Foreign Application Priority Data

Dec. 27, 1990 [JP] Japan ................................ 4-15204

[51] Int. Cl.$^5$ ................................................. G03C 5/00
[52] U.S. Cl. ..................................... 430/326; 430/324; 430/325
[58] Field of Search ......................... 430/326, 325, 324

[56] References Cited

U.S. PATENT DOCUMENTS 3,873,361  3/1975  Franco et al. ........................ 430/324
5,169,494  12/1992  Hashimoto et al. .................. 430/326

FOREIGN PATENT DOCUMENTS 0154932  9/1985  European Pat. Off. .
58-64028  4/1983  Japan .
58-198040  11/1983  Japan .
61-250635  11/1986  Japan .
63-51637  3/1988  Japan .
63-178529  7/1988  Japan .
2-143254  6/1990  Japan .

OTHER PUBLICATIONS

Technical Digest, Dec. 1982, pp. 391-394, "International Electron Devices Meeting".
Solid State Technology, vol. 29, No. 6, Jun. 1986, pp. 143-148, "Multilayer Resist Processing: Economic Considerations".
Patent Abstracts of Japan, vol. 14, No. 264 (P-1057)7, Jun. 1990, JP-A-20 72 364.

Primary Examiner—Marion E. McCamish
Assistant Examiner—Mark A. Chapman
Attorney, Agent, or Firm—Oblon, Spivak, McClelland, Maier & Neustadt

[57] ABSTRACT

A resist pattern is formed by
(a) forming a thick film of a positive photoresist on a substrate,
(b) forming a light-shielding film directly on a surface of the thick film of the positive photoresist,
(c) processing the light-shielding film into a pattern,
(d) exposing the thick film of the positive photoresist to light, and
(e) developing the exposed, thick film of the positive photoresist.

According to this method, a thick, fine pattern of a photoresist can be accurately and advantageously formed.

2 Claims, No Drawings

METHOD OF FORMING FINE RESIST PATTERN

TECHNICAL FIELD

The present Invention relates to a method of forming a thick, fine resist pattern.

TECHNICAL BACKGROUND

Most of electronic machines produced in recent years have many semiconductor devices and many circuit substrates. Patterns for wiring and connection terminals in these semiconductor devices and circuit substrates are generally produced by a processing technique in which a thin, fine resist pattern of a photosensitive resin (to be referred to as "photoresist" hereinafter) is formed on a substrate and then, the substrate is etched.

The formation of a thin, fine resist pattern of a photoresist is generally carried out by a method In which the film surface of the photoresist formed on a substrate is exposed to light through a photomask having a light-shielding pattern.

In the above method, generally, the film thickness of a photoresist formed on a substrate is 0.5 to 3 $\mu$m when the photoresist is formed by coating a solution of the photoresist, and the film thickness is less than 50 $\mu$m even when a film-like photoresist called a dry film is stacked. Therefore, the film thickness of a fine resist pattern formed by the above method is inevitably less than 50 $\mu$m.

Meanwhile, for example, in the production of a printed circuit substrate on which a semiconductor device is to be mounted directly and a mounting wiring substrate typified by TAB (tape automated bonding) for connecting lead frames or a semiconductor device to a printed circuit substrate, it is being desired to establish a technique for forming a highly accurate resist pattern having, for example, a thickness of 50 to 500 $\mu$m.

In the above method, however, when a photoresist formed on a substrate has a film thickness of 50 $\mu$m or more, it is required to increase exposure energy so that the photoresist is exposed up to its bottom in exposing the photoresist to light through a photomask. However, when the exposure energy is increased, ultraviolet light reaches even a place below a pattern of a light-shielding film, and no proper pattern can be obtained.

DISCLOSURE OF THE INVENTION

It is an object of the present invention to provide a novel method of forming a thick, fine resist pattern.

It is another object of the present invention to provide a method of forming a thick, fine resist pattern, in which a light-shielding film is formed directly on a photoresist, and the photoresist is exposed to light and is developed to form a fine resist pattern.

Other objects and advantages of the present invention will be apparent from the following description.

According to the present invention, the above objects and advantages of the present invention are achieved by a method of forming a fine resist pattern, which comprises:

(a) forming a thick film of a positive photoresist on a substrate, (b) forming a light-shielding film directly on a surface of the thick film of the positive photoresist, (c) processing the light-shielding film into a pattern, (d) exposing the thick film of the positive photoresist to light, and (e) developing the exposed, thick film of the positive photoresist.

The present invention will be detailed hereinafter.

As described above, in the step (a) of the method of the present invention, a thick film of a positive photoresist is formed on a substrate.

The positive photoresist used in this (a) step is preferably selected from those which are developed with a developer of an alkaline aqueous solution. Examples of this positive photoresist include a positive photoresist obtained by mixing a resin which is soluble in an alkaline aqueous solution (to be referred to as "alkali-soluble resin" hereinafter) with 1,2-quinonediazidesulfonic acid ester and a positive photoresist consisting of a compound obtained by condensing an alkali-soluble resin and 1,2-quinonediazidesulfonic acid halide.

Examples of the alkali-soluble resin include a novolak resin, polyhydroxystyrene or its derivative, a styrene-maleic anhydride copolymer, cellulose acetate hydrodiene phthalate, polyvinyl hydroxybenzoate, polyhydroxybenzal, and a carboxyl group-containing acrylic resin.

Of the above alkali-soluble resins, preferred are a novolak resin and polyhydroxystyrene or its derivative.

The above novolak resin is obtained by addition-condensing an aromatic compound having a phenolic hydroxyl group (to be simply referred to as "phenol" hereinafter) and an aldehyde in the presence of an acid catalyst preferably in such amounts that the amount of the aldehyde is 0.7 to 1 mole per mole of the phenol. Examples of the phenol used above include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 3,6-xylenol, 2,3,5-trimethylphenol, 3,4,5-trimethylphenol, p-phenylphenol, resorcinol, hydroquinone, hydroquinone monomethyl ether, pyrogallol, phloroglucinol, hydroxydiphenol, bisphenol A, gallic acid, gallic acid ester, $\alpha$-naphthol and $\beta$-naphthol. Examples of the aldehyde include formaldehyde, p-formaldehyde, furfural, benzaldehyde, nitrobenzaldehyde and acetaldehyde. Examples of the acid catalyst include hydrochloric acid, nitric acid, sulfuric acid, formic acid, oxalic acid and acetic acid.

Examples of the above polyhydroxystyrene or its derivative include poly(o-hydroxystyrene), poly(m-hydroxystyrene), poly(p-hydroxystyrene), poly($\alpha$-methyl-o-hydroxystyrene), poly($\alpha$-methyl-m-hydroxystyrene), poly($\alpha$-methyl-p-hydroxystyrene), partial acetylation products of these and silylation products of these.

Examples of the above 1,2-quinonediazidesulfonic acid ester include 1,2-benzoquinonediazide-4-sulfonic acid ester, 1,2-naphthoquinonediazide-4-sulfonic acid ester and 1,2-naphthoquinonediazide-5-sulfonic acid ester.

Examples of the above 1,2-quinonediazidesulfonic acid halide include 1,2-benzoquinonediazide-4-sulfonic acid chloride, 1,2-naphthoquinonediazide-4-sulfonic acid chloride and 1,2-naphthoquinonediazide-5-sulfonic acid chloride.

For forming a thick film of a positive photoresist on a substrate, known methods can be employed. For example, a spin coating method can be advantageously used. In this method, the maximum thickness of a film which can be formed by one spin coating operation is about 25 $\mu$m, while a thick film of a positive photoresist can be formed by spin coating a positive photoresist solution to form a photoresist film, then evaporating a solvent of a spin-coated, positive photoresist solution and again spin coating a positive photoresist solution on the photoresist film.

When a substrate has a large size or when a substrate has a large weight, a load is sometimes on the rotating axis of a spin coater to prevent stable spinning. In cases where such a happening is anticipated, there is employed a bar coating method in which a positive photoresist solution dropped on a substrate is uniformly spread with a bar spaced from the substrate or a roll coating method in which a positive photoresist solution adhering to a roll is transferred to a substrate, whereby a thick film of the positive photoresist can be stably and uniformly formed.

The solvent for preparation of a positive photoresist solution can be selected, for example, from ethylene glycol alkyl ethers such as ethylene glycol monomethyl ether, ethylene glycol monoethyl ether, ethylene glycol monopropyl ether and ethylene glycol monobutyl ether; diethylene glycol dialkyl ethers such as diethylene glycol dimethyl ether, diethylene glycol diethyl ether, diethylene glycol dipropyl ether and diethylene glycol dibutyl ether; ethylene glycol alkyl acetates such as methyl cellosolve acetate and ethyl cellosolve acetate; propylene glycol alkyl ether acetates such as propylene glycol monomethyl ether acetate, propylene glycol monoethyl ether acetate and propylene glycol propyl ether acetate; aromatic hydrocarbons such as toluene and xylene; ketones such as methyl ethyl ketone and cyclohexane; and esters such as methyl 2-hydroxypropionate, ethyl 2-hydroxypropionate, ethyl 2-hydroxy-2-methyl propionate, ethyl ethoxyacetate, ethyl oxyacetate, methyl 2-hydroxy-3-methylbutanoate, 3-methoxybutylacetate, 3-methyl-3-methoxybutyl acetate, 3-methyl-3-methoxybutyl propionate, 3-methyl-3-methoxybutyl butyrate, ethyl formate, ethyl acetate, butyl acetate, methyl acetoacetate, and ethyl acetoacetate. In view of ease in forming a thick film of a positive photoresist, it is preferred to use solvents having a boiling point of 40° to 100° C. under atmospheric pressure. The solid content in a positive photoresist solution is preferably 10 to 50% by weight.

The substrate on which a thick film of a positive photoresist having a desired thickness has been formed is generally advantageously subjected to drying treatment called prebaking before used in the next step (b). This drying treatment refers to a treatment in which the temperature of the above substrate is elevated up to 80° to 100° C. with a heating oven or a heating plate to evaporate a solvent contained in the thick film of a positive photoresist.

The so-formed thick film of a positive photoresist preferably has a thickness of 50 to 500 $\mu$m.

In the step (b) of the present invention, a light-shielding film is formed directly on the thick film of a positive photoresist formed on the substrate in the step (a).

The light-shielding film forms a pattern which blocks off ultraviolet light to which the thick film of a positive photoresist is exposed. It is therefore required to prepare the light-shielding film from a material which does not allow to transmit ultraviolet light, or to provide it with a film thickness sufficient to prevent the transmission of ultraviolet light, such that ultraviolet light is blocked off. Generally, a metal is easily available as a material to block off ultraviolet light. Further, since a thin film is suitable for easily forming a fine pattern as a photomask, a metal which is capable of forming a thin film is preferred as a material to form a light-shielding film.

The method of forming the thin film of a metal, i.e., a metal film, includes a vapor deposition method and a sputtering method as the most universal methods. In the present invention, a vapor deposition method in which a metal is heated and evaporated in a vacuum to form a metal film on the thick film of a positive photoresist can be relatively easily used and is preferred as a method of forming a light-shielding film.

The reason therefor is that the evaporation method has no influence of high heat and an external force on the thick film of a positive photoresist.

When the metal film is formed by a vapor deposition method in the present invention, particularly, it is advantageous to use a pure metal material having a low melting point for avoiding a thermal effect on the thick film of a positive photoresist. As another aspect, the consistency of the light-shielding film with the thick film of a positive photoresist in thermal expansion coefficient has a great influence on the structural stability of the light-shielding film. When the consistency is poor, the light-shielding film is liable to undergo cracking or wrinkling. It is therefore preferred to use a metal material having almost the same thermal expansion coefficient as that of the positive photoresist.

The above metal material preferably includes metals having a vaporizing temperature of not higher than 1,000° C., such as gold, copper, nickel, lead, tin, indium and zinc and alloys of these metals. In view of the consistency of the light-shielding film with the positive photoresist in thermal expansion coefficient, particularly preferred is lead, tin, indium, copper or alloys of these.

When a metal film is used as a light-shielding film, the thickness of the film is generally 0.005 to 0.1 $\mu$m.

When a metal film is used as a light-shielding film, in the method of the present invention, the light-shielding film is processed into a pattern by etching the light-shielding film in a pattern form in the step (c). This pattern processing is carried out by forming a negative photoresist pattern, for example, of a cyclized rubber or acrylic type on the light-shielding film by a known photolithographic method, and then etching the metal film, for example, by a wet method. As an etching solution used for etching by a wet method, there may be used, for example, an aqueous solution containing 0.05 to 5% by weight of ferric chloride when the metal film is formed of lead, tin, copper or indium. The etching solution differs depending upon the kind of the metal film, and it is required not to attack the thick film of a positive photoresist. The details thereof are described in "Photolithoetching and Fine Processing" (Sogo Denshi Shuppansha). Further, a dyeable resin having photosensitivity (to be referred to as "photosensitive dyeable substance" hereinafter) can be preferably used for a light-shielding film.

Examples of the above photosensitive dyeable substance include a composition obtained by mixing a natural protein such as gelatin, casein or fish glue with a photo-crosslinking agent such as dichromate or a bisazide compound, a composition obtained by mixing a water-soluble polymer such as polyvinyl alcohol or polyvinyl pyrrolidone with the above photo-crosslinking agent, a composition obtained by mixing a (co)polymer of monomer(s) having a cationic group with the above photo-crosslinking agent (see Japanese Laid-open Patent Publication No. 285402/1986), and a composition obtained by mixing a copolymer of N-vinyl-2-pyrrolidinone, a monomer having a quaternary amine structure and a polymerizable unsaturated bond and (meth)acrylic acid ester with the above photo-crosslinking agent (see Japanese Laid-open Patent Publication No. 155412/1984).

The light-shielding film of the photosensitive dyeable substance is formed by applying a solution of the photosensitive dyeable substance according to the above method of applying the positive photoresist solution, and prebaking the resultant coating. The solvent used for preparation of the solution of the photosensitive dyeable substance is selected from solvents which do not dissolve the thick film of a positive photoresist, such as water. The solid content in the solution of the photosensitive dyeable substance is generally 1 to 10% by weight. Further, the thickness of the light-shielding film of the photosensitive dyeable substance is preferably 0.1 to 2 μm.

When the photosensitive dyeable substance is used for a light-shielding film, in the step (c) of the method of the present invention, the processing of the light-shielding film into a pattern is carried out by irradiating the light-shielding film with ultraviolet light through a photomask having a pattern form, and developing the light-shielding film. In this case, the developer is selected from solvents which do not dissolve the thick film of a positive photoresist, such as water.

After the photosensitive dyeable substance has been processed into a pattern, the pattern is dyed in order to increase the shielding effect of the pattern against ultraviolet light. The dye for dyeing is properly selected depending upon the material of the pattern. Examples of the dye include acidic dyes such as Lanasyn Black BRL (supplied by Mitsubishi Kasei Corporation), Kayakaran Black 2RL (supplied by Nippon Kayaku K.K.), Black 205 (supplied by Nippon Kayaku K.K.), and Black 181 (supplied by Nippon Kayaku K.K.). The pattern is dyed, for example, by immersing the substrate having the thick film of a photoresist with the pattern on it in an aqueous solution containing 0.1 to 2% by weight of the dye, and the pattern is generally washed with water after dyed.

Further, in the present invention, the thick film of a positive photoresist with the above pattern of the light-shielding film on it is exposed to light by a method known per se in the step (d). Then, the thick film is developed by a method known per se in the step (e), and further rinsed with water.

In the exposure in the step (d), it is preferred to carry out the exposure such that the thick film of a positive photoresist is exposed about 5 μm deep by one exposure operation. Therefore, for example, when the thick film of a positive photoresist has a thickness of 100 μm, and when the thick film is exposed 5 μm deep per exposure operation, the exposure operation is repeated 20 times and the development is carried out after each exposure operation, whereby a fine pattern of a positive photoresist film having a thickness of 100 μm is finally formed.

As a developer used for developing the above positive photoresist, there is used an alkaline aqueous solution containing 1 to 10% by weight of any one of inorganic alkalis such as sodium hydroxide, potassium hydroxide and ammonia water, amines such as triethylamine and triethanolamine, quaternary ammonium salts such as tetramethylammonium hydroxide, tetraethylammonium hydroxide and choline, and cyclic amines such as pyrrole, piperidine, 1,8-diazabicyclo(5,4,0)-7-undecene and 1,5-diazabicyclo(4,3,0)-5-nonane.

The above developer may also contain a suitable amount of water-soluble organic solvents, e.g. alcohols such as methanol and ethanol or surfactants.

In addition, some materials of the light-shielding film forming a pattern on the thick film of a positive photoresist may permit the development by etching with anisotropic oxygen plasma.

One of the features of the present invention is that the direct formation of a pattern of the light-shielding film on the thick film of a positive photoresist obviates the necessity of positioning of the pattern of the light-shielding film for every exposure even when the exposure and development are repeated a plurality of times as described above, and hence, that the present invention does not incur any disadvantage which naturally occurs when the positioning is conducted a plurality of times.

On the other hand, when the cycle of exposure and development is carried out a plurality of times, that portion of the thick film of a positive photoresist which is near to the light-shielding film in the thickness or depth direction or in other words, far from the substrate or shallow in the thickness or depth direction, is immersed in a developer a plurality of times, and hence, there occurs a so-called over-phenomenon that the above portion is, although in a very small amount, dissolved in the developer. According to the method of the present invention, nevertheless, there can be formed a positive photoresist with the resultant thick, fine pattern having an aspect ratio (a ratio of the thickness of a positive photoresist to the width thereof: thickness/width) of about 5.

A thick, fine pattern of a positive photoresist, obtained by the method of the present invention, enables the formation of a thick metal film having a fine pattern, for example, by stacking a metal such as copper, nickel, etc., in a thick layer on that portion on the substrate which has no resist as a protection film against plating by electric plating to form a plated pattern and then removing the thick film of the positive photoresist. Further, a fine, thick paste pattern can be also easily obtained, for example, by filling a paste in that portion on a glass substrate which has no thick film of a positive photoresist with fine pattern, solidifying it, and then removing the thick film of the positive photoresist.

For the above removal of the thick film of a positive photoresist, known removers are used, such as phenol, cresol, p-dichlorobenzene, o-dichlorobenzene, a mixture of N-alkyl-2-pyrrolidone with diethylene glycol (see Japanese Laid-open Patent Publication No. 26340/1985), morpholine, a mixture of morpholine with N,N'-dimethylformamide (see Japanese Laid-open Patent Publication No. 80638/1983) and a mixture of lactam with morpholine (see Japanese Laid-open Patent Publication No. 110454/1988).

EXAMPLES

The present invention will be explained more specifically hereinafter. However, the present invention shall not be limited by these Examples. In the Examples, thick pattern of positive photoresists, prepared according to the method of the present invention, was evaluated by observing forms of cross-sections of the patterns with a scanning electron microscope, and patterns having a width of the top portion/width of the bottom portion of at least 90% were taken as being excellent.

EXAMPLE 1

A positive photoresist solution having a solid content of 30% by weight, prepared by dissolving 100 parts by weight of a novolak resin and 30 parts by weight of 1,2-naphthoquinone-5-sulfonic acid ester in acetone, was applied to a 100 mm×100 mm×0.3 mm, nickel-plated stainless steel substrate at room temperature by a casting method. This substrate was prebaked at 80° C. for 2 hours to form a thick film of a positive photoresist having a thickness of 200 μm. Then, a thin film of lead having a thickness of 0.01 μm was formed on the surface of the positive photoresist by vacuum vapor deposition. Then, a cyclized rubber-containing negative photoresist (CIR-702: supplied by Japan Synthetic Rubber Co., Ltd.) was spin-coated on the thin film of lead such that the dry film thickness was 1 μm, and the negative photoresist was prebaked at 80° C. for 30 minutes. Thereafter, the negative photoresist was irradiated with ultraviolet light at 7 mJ/cm² through a photomask having a test pattern, developed with n-hexane and rinsed with an n-hexane/butyl acetate mixed solvent (n-hexane/butyl acetate=1/1 (by volume)) to form a pattern of the negative photoresist. The thin film of lead was etched by immersing the so-obtained substrate in an aqueous solution containing 1% by weight of ferric chloride at room temperature for 1 minute to form a pattern of a light-shielding film. The substrate on which this pattern of the light-shielding film was formed was further exposed to ultraviolet light at 100 mJ/cm² through the above pattern of the 1light-shielding film, developed with an aqueous solution containing 2.4% by weight of tetramethylammonium hydroxide as the developer at room temperature for 1 minute, and rinsed with water to form a pattern having a thickness of 4 μm. This substrate was repeatedly exposed and developed 50 times under the same conditions as above to form an excellent pattern of the positive photoresist having a thickness of 200 μm. This pattern had a minimum width of 50 μm.

While the substrate having the above pattern of the positive photoresist was used as an electrode, the substrate was subjected to electroplating with nickel in a nickel plating solution containing nickel sulfamate to form a nickel plating having a thickness of 200 μm. Then, the positive photoresist portion was peeled off the stainless steel substrate with a remover containing morpholine to obtain a stainless steel substrate having an excellent fine pattern formed of nickel.

EXAMPLE 2

A positive photoresist having a solid content of 30% by weight, prepared by dissolving 100 parts by weight of a novolak resin and 25 parts by weight of 1,2-naphthoquinone-5-sulfonic acid ester in ethyl cellosolve acetate, was spin-coated on a silicon wafer having a diameter of 5 inches at 1,000 rpm and prebaked at 80° C. for 30 minutes, and the above spin-coating and prebaking procedures were repeated to form a thick film of the positive photoresist having a thickness of 120 μm. Then, a thin film of copper having a thickness of 0.01 μm was formed on the surface of the positive photoresist by a vacuum vapor deposition method. Then, in the same manner as in Example 1, a pattern of a negative photoresist was formed on the thin film of copper, and further the thin film of copper was etched to form a pattern of a light-shielding film. The substrate on which this pattern of a light-shielding film was formed was repeatedly subjected to the exposure to ultraviolet light at 100 mJ/cm², development and rinsing 30 times in the same manner as in Example 1 to form an excellent pattern of the positive photoresist having a thickness of 120 μm. This pattern had a minimum width of 30 μm.

EXAMPLE 3

A thin film of gold was formed on the entire surface of a 150 mm×150 mm×1.1 mm glass substrate by a sputtering. Thereafter, the same positive photoresist as that used in Example 2 was applied to the above substrate with a roll coater and prebaked at 90° C. for 30 minutes, and the above procedures were repeated 30 times to form a thick film of the positive photoresist having a thickness of 440 μm. Then, a thin film of indium having a thickness of 0.05 μm was formed on the surface of the positive photoresist by a vacuum vapor deposition method. Then, a pattern of a negative photoresist was formed on the thin film of indium, and further the thin film of indium was etched, in the same manner as in Example 1 to form a pattern of a light-shielding film. The substrate on which this pattern of a light-shielding film was formed was repeatedly subjected to the exposure to ultraviolet light at 150 mJ/cm², development and rinsing 90 times in the same manner as in Example 1 to form an excellent pattern of the positive photoresist having a thickness of 44 μm. This pattern had a minimum width of 50 μm.

While the substrate having this pattern of the positive photoresist was used as an electrode, the substrate was subjected to electroplating with copper in a copper plating solution consisting of a copper sulfate aqueous solution. Then, the substrate was cooled to 0° C., and immediately thereafter, heated to 100° C. to separate the glass portion of the substrate and the gold thin film portion, and further, the positive photoresist portion was peeled off in the same manner as in Example 1 to obtain a thin film of gold laving an excellent fine pattern of copper.

EXAMPLE 4

A thick film of a positive photoresist having a thickness of 105 μm was formed on a substrate of a gold-plated silicon wafer having a diameter of 5 inches in the same manner as in Example 2. Then, a negative photosensitive dyeable substance solution having a solid content of 5% by weight, prepared by dissolving polyvinyl pyrrolidone in water, was spin-coated on the surface of the positive photoresist such that the dry film thickness was 1 μm, and the substrate was prebaked at 80° C. for 30 minutes. Thereafter, the film of the photoresist dyeable substrate was irradiated with ultraviolet light at 10 mJ/cm² through a photomask having a test pattern, and developed with water to form a pattern of the photosensitive dyeable substance. Then, the pattern of the photosensitive dyeable substance was dyed by immersing the substrate in an acetic acid aqueous solution (acetic acid concentration 3% by weight) containing 0.5% by weight of a black acidic dye (Black 181, supplied by Nippon Kayaku K.K.), and the substrate was rinsed with water to form a pattern of a light-shielding film. The substrate on which this pattern of a light-shielding film was formed was repeatedly subjected to the exposure to ultraviolet light at 100 mJ/cm², development and rinsing 25 times in the same manner as in Example 1 to form an excellent pattern of the positive photoresist having a thickness of 105 μm. This pattern had a minimum width of 20 μm.

We claim:

1. A method of forming a fine resist pattern, which comprises:
   (a) forming a film of a positive photoresist on a substrate, said film having a thickness of 50 to 500 $\mu$m,
   (b) forming a light-shielding film directly on a surface of the film of the positive photoresist, said light-shielding film having a thickness of 0.005–0.1 $\mu$m and being formed of metal selected from the group consisting of lead, tin, indium, copper and alloys of these,
   (c) processing the light-shielding film into a pattern,
   (d) exposing the film of the positive photoresist to light, and
   (e) developing the exposed film of the positive photoresist.

2. The method of forming a fine resist pattern as claimed in claim 1, wherein said light-shielding film and said positive photoresist have substantially the same thermal expansion coefficient.

* * * * *

UNITED STATES PATENT AND TRADEMARK OFFICE
CERTIFICATE OF CORRECTION

PATENT NO. : 5,340,702
DATED : August 23, 1994
INVENTOR(S) : Hiroyuki HIRASAWA, et al.

It is certified that error appears in the above-indentified patent and that said Letters Patent is hereby corrected as shown below:

On the Title Page, Item [30], the Foreign Application Priority Number should read:

--2-415204--

Signed and Sealed this

Eighth Day of November, 1994

Attest:

BRUCE LEHMAN

Attesting Officer

Commissioner of Patents and Trademarks